United States Patent [19]

Oida

[11] Patent Number: 5,894,252

[45] Date of Patent: Apr. 13, 1999

[54] LAMINATED CERAMIC ELECTRONIC COMPONENT WITH A QUADRANGULAR INNER CONDUCTOR AND A METHOD FOR MANUFACTURING THE SAME

[75] Inventor: Toshifumi Oida, Nagaokakyo, Japan

[73] Assignee: Murata Manufacturing Co., Ltd., Japan

[21] Appl. No.: 08/963,093

[22] Filed: Nov. 3, 1997

Related U.S. Application Data

[63] Continuation of application No. 08/839,601, Apr. 15, 1997, abandoned, which is a continuation of application No. 08/414,911, Mar. 31, 1995, abandoned.

[30] Foreign Application Priority Data

Apr. 4, 1994 [JP] Japan ............... 6-090490

[51] Int. Cl.$^6$ ............... H01P 1/20; H01P 7/00
[52] U.S. Cl. ............... 333/202; 333/219; 333/204; 29/829
[58] Field of Search ............... 333/202–207, 333/219, 222, 223, 175, 185; 29/829

[56] References Cited

U.S. PATENT DOCUMENTS

| 4,506,241 | 3/1985 | Makimoto et al. | 333/206 X |
|---|---|---|---|
| 4,583,064 | 4/1986 | Makimoto et al. | 333/219 |
| 4,785,271 | 11/1988 | Higgins, Jr. | 333/204 |
| 5,124,676 | 6/1992 | Ueno | 333/206 |
| 5,160,905 | 11/1992 | Hoang | 333/204 |
| 5,349,314 | 9/1994 | Shimizu et al. | 333/204 |
| 5,404,120 | 4/1995 | Agahi-Kesheh | 333/206 |
| 5,410,285 | 4/1995 | Konishi | 333/206 |
| 5,489,882 | 2/1996 | Ueno | 333/206 |

FOREIGN PATENT DOCUMENTS 4-312002  11/1992  Japan ............... 333/204

Primary Examiner—Seungsook Ham
Attorney, Agent, or Firm—Ostrolenk, Faber, Gerb & Soffen, LLP

[57] ABSTRACT

A resonator 20 as an example of a laminated ceramic electronic component includes a first dielectric layer 22a. Two long and narrow holes (grooves) 24a and 24b are formed in the first dielectric layer 22a. A quadrangular cylindrical inner conductor 26 as a pattern electrode is formed in the vicinity of the holes 24a and 24b of the first dielectric layer 22a and inside the holes 24a and 24b. A second dielectric layer 22b and a first earth electrode 32a are formed on the first dielectric layer 22a. A third dielectric layer 22c, a second earth electrode 32b and a fourth dielectric layer 22d are formed under the first dielectric layer 22a.

7 Claims, 18 Drawing Sheets

5,894,252

1

LAMINATED CERAMIC ELECTRONIC COMPONENT WITH A QUADRANGULAR INNER CONDUCTOR AND A METHOD FOR MANUFACTURING THE SAME

This is a Continuation of application Ser. No. 08/839,601, filed on Apr. 15, 1997 (now abandoned), which is a continuation of application Ser. No. 08/414,911, filed on Mar. 31, 1995, now abandoned.

BACKGROUND OF THE INVENTION

1. Field of the Invention

The present invention relates to a laminated ceramic electronic component and a method for manufacturing the same, and more particularly, to a laminated ceramic electronic component such as a resonator, a filter, an inductor, a delay line, a coupler or the like having a pattern electrode such as an inner conductor and a method for manufacturing the same.

2. Description of the Prior Art

FIG. 19 is an exploded front view showing an example of a conventional resonator which is in the background of the present invention, and FIG. 20 is a sectional illustrative view showing an essential portion thereof. The resonator 1 shown in FIG. 19 and FIG. 20 includes a first dielectric layer 2a. A band-shaped inner conductor 3 as a pattern electrode is formed on one main surface of the first dielectric layer 2a. Furthermore, a second dielectric layer 2b is formed on one main surface of the first dielectric layer 2a so as to cover the inner conductor 3. A first earth electrode 4a is formed on the second dielectric layer 2b so as to oppose the inner conductor 3. Also, a second earth electrode 4b is formed on the other main surface of the first dielectric layer 2a so as to oppose the inner conductor 3. Furthermore, a third dielectric layer 2c is formed on the other main surface of the first dielectric layer 2a so as to cover the second earth electrode 4b. Thus, a strip line is formed of the first and the second dielectric layers 2a and 2b, the inner conductor 3, and the first and the second earth electrodes 4a and 4b.

Conductive paste to form the inner conductor is printed on one main surface of a first ceramic green sheet so as to form a thick film thereon Conductive paste to form each of the earth electrodes is printed on each one main surface of second and third ceramic green sheets so as to form a thick film thereon. Then, the second and the third ceramic green sheets are laminated on both main surfaces of the first ceramic green sheet, these ceramic green sheets and so on are bonded by pressing, sintered and so on, thereby the resonator 1 shown in FIG. 19 and FIG. 20 is formed.

FIG. 21 is a perspective view showing an example of a conventional filter which is in the background of the present invention, and FIG. 22 is an exploded perspective view thereof. The filter 10 includes a first dielectric layer 11a. Two band-shaped inner conductors 12a and 12b as pattern electrodes are formed in parallel with each other at an interval on one main surface of the first dielectric layer 11a. The inner conductors 12a and 12b are electromagnetically coupled with each other. Furthermore, a second dielectric layer 11b is formed on one main surface of the first dielectric layer 11a so as to cover the inner conductors 12a and 12b. Two capacitor electrodes 13a and 13b are formed on the second dielectric layer 11b. Furthermore, a third dielectric layer 11c is formed on the second dielectric layer 11b so as to cover the capacitor electrodes 13a and 13b. Two capacitor electrodes 13c and 13d are formed on the third dielectric layer 11c so as to oppose the two capacitor electrodes 13a

2 and 13b. Furthermore, a fourth dielectric layer 11d is formed on the third dielectric layer 11c so as to cover the capacitor electrodes 13c and 13d. A first earth electrode 14a is formed on the fourth dielectric layer 11d. Also, two capacitor electrodes 13e and 13f are formed on the other main surface of the first dielectric layer 11a. Furthermore, a fifth dielectric layer 11e is formed on the other main surface of the first dielectric layer 11a so as to cover the capacitor electrodes 13e and 13f. A second earth electrode 14b is formed under the fifth dielectric layer 11e so as to oppose the two capacitor electrodes 13e and 13f. Furthermore, a sixth dielectric layer 11f is formed under the fifth dielectric layer 11e so as to cover the second earth electrode 14b.

Six outer electrodes 15a through 15f are formed on side surfaces of the first through the sixth dielectric layers 11a through 11f. The outer electrodes 15a and 15d are connected with the capacitor electrodes 13c and 13d, respectively. The outer electrodes 15a and 15d are used as input/output terminals. The outer electrode 15b is connected with one end of the inner conductor 12a and the capacitor electrodes 13a and 13e. The outer electrode 15c is connected with one end of the inner conductor 12b and the capacitor electrodes 13b and 13f. The outer electrodes 15e and 15f are connected with the first and the second earth electrodes 14a and 14b. The outer electrodes 15e and 15f are used as earth terminals.

Thus, in the filter 10 shown in FIG. 21 and FIG. 22, a resonator consisting of a strip line is formed of the first through the fifth dielectric layers 11a through 11e, the inner conductor 12a, and the first and the second earth electrodes 14a and 14b, and another resonator consisting of another strip line is formed of the first through fifth dielectric layers 11a through 11e, the inner conductor 12b, and the first and the second earth electrodes 14a and 14b. In this case, since the inner conductors 12a and 12b are electromagnetically coupled with each other, the two resonators are also electromagnetically coupled with each other. Furthermore, in the filter 10, each capacitor is formed between the capacitor electrodes 13a and 13c, between the capacitor electrodes 13b and 13d, between the capacitor electrode 13e and the second earth electrode 14b, and between the capacitor electrode 13f and the second earth electrode 14b. Accordingly, the filter 10 has an equivalent circuit shown in FIG. 23.

Conductive paste to form the inner conductors is printed on one main surface of a ceramic green sheet so as to form a thick film thereon. Conductive paste to form the capacitor electrodes is printed on each one main surface of the other ceramic green sheets so as to form a thick film thereon. Furthermore, conductive paste to form the earth electrodes is printed on each one main surface of the other ceramic green sheets so as to form a thick film thereon. Then, these ceramic green sheets and so on are laminated, bonded by pressing, sintered and so on, thereby the filter 10 shown in FIG. 21 and FIG. 22 is formed.

However, in the resonator 1 shown in FIG. 19 and FIG. 20, since the inner conductor 3 is formed by printing conductive paste so as to form a thick film, the thickness t (shown in FIG. 20) of the inner conductor 3 is as small as about 10 μm. Therefore, in the resonator 1, the resistance component and the ohmic loss of the inner conductor 3 as a pattern electrode are large, and Q is small.

Similarly, in the filter 10 shown in FIG. 21 and FIG. 22, since the inner conductors 12a and 12b are formed by printing conductive paste so as to form a thick film, each thickness of the inner conductors 12a and 12b is as small as about 10 μm. Therefore, in the filter 10, each resistance component and each ohmic loss of the inner conductors as pattern electrodes are large, each Q of the resonators is small, and the insertion loss is large.

SUMMARY OF THE INVENTION

Therefore, it is a primary object of the present invention to provide a laminated ceramic electronic component wherein a resistance component of a pattern electrode is small.

It is another object of the present invention to provide a method for manufacturing a laminated ceramic electronic component, which can provide a laminated ceramic electronic component wherein a resistance component of a pattern electrode is small.

A laminated ceramic component according to the present invention is a laminated ceramic electronic component having a pattern electrode, wherein the pattern electrode comprises a long and narrow plane portion extending in parallel with a main surface of a ceramic layer, and a side portion extending from the plane portion in a direction intersecting with the main surface of the ceramic layer in a range from one end of the plane portion to the other end thereof in a longitudinal direction thereof.

A method for manufacturing a laminated ceramic electronic component according to the present invention comprises a step of preparing a ceramic green sheet to form the ceramic layer, a step of forming a hole in the ceramic green sheet at a portion where the side portion of the pattern electrode is formed, a step of applying a conductive material to form the side portion of the pattern electrode in the hole of the ceramic green sheet, a step of applying a conductive material to form the plane portion of the pattern electrode to the vicinity of the hole of the ceramic green sheet, and a step of sintering the ceramic green sheet.

The pattern electrode comprises the narrow and long plane portion extending in parallel with the main surface of the ceramic layer, and the side portion extending from the plane portion in the direction intersecting with the main surface of the ceramic layer in the range from one end of the plane portion to the other end thereof in the longitudinal direction thereof. Therefore, the surface area of the pattern electrode is increased. Since the surface area of the pattern electrode is increased, the resistance of the pattern electrode becomes small.

According to the present invention, a laminated ceramic electronic component has a small resistance component of a pattern electrode. Thus, according to the present invention, a resonator having a large Q, a filter having a small insertion loss and the like can be obtained.

The above and other objects, features, aspects and advantages of the present invention will become more apparent from the following detailed description of the embodiment with reference to the accompanying drawings.

DESCRIPTION OF THE PREFERRED EMBODIMENTS

Figure 1:
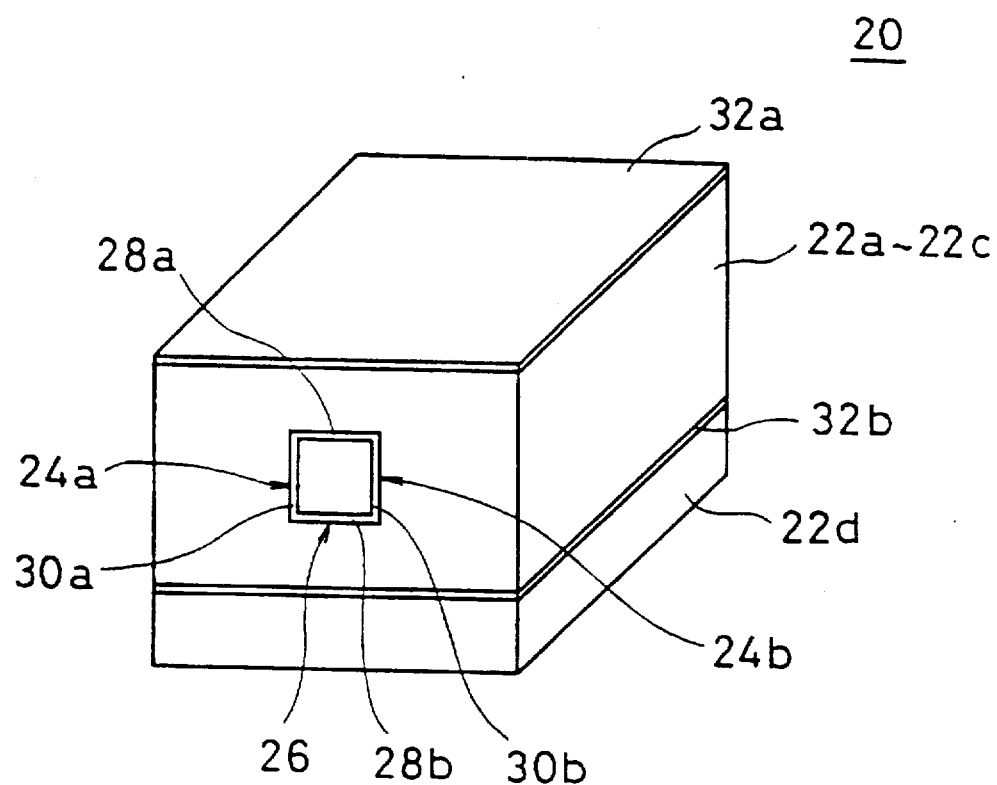
FIG. 1 is a perspective view showing an example of a resonator as an embodiment of the present invention.
Figure 2:
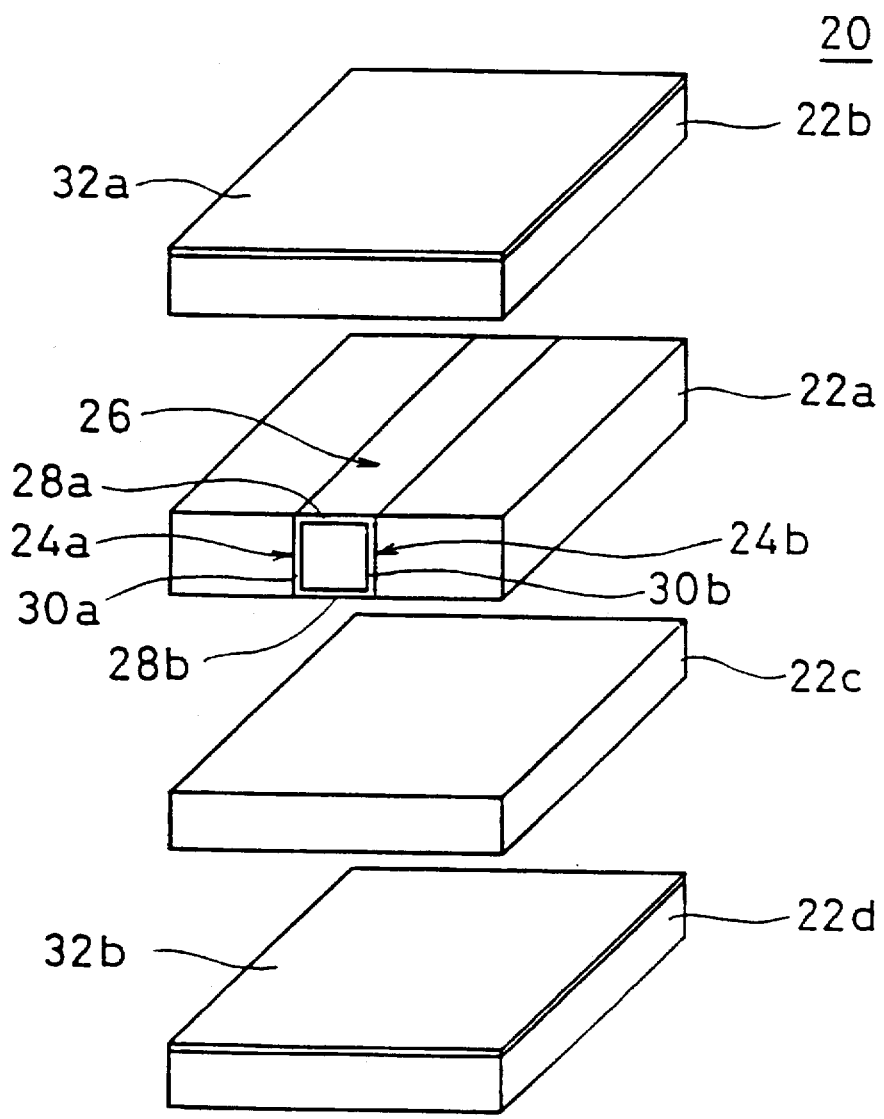
FIG. 2 is an exploded perspective view showing the resonator shown in FIG. 1.
Figure 3:
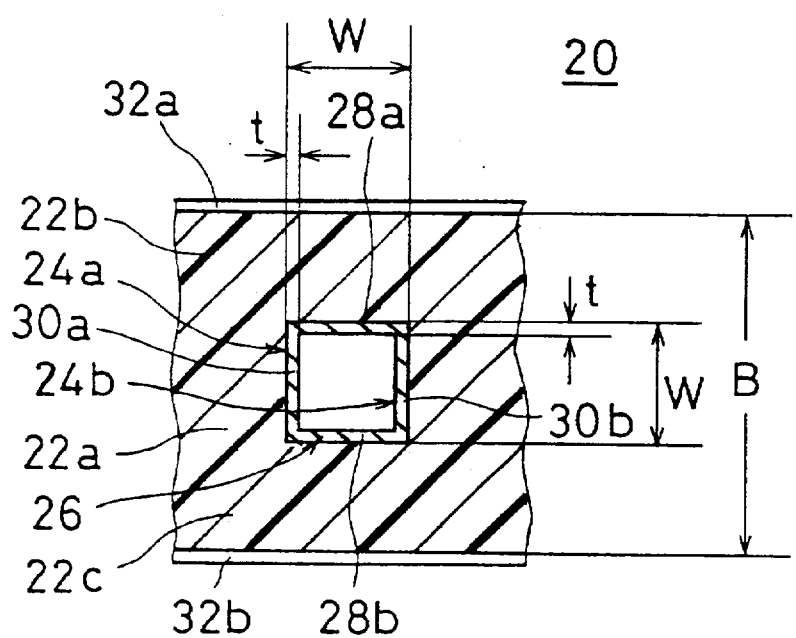
FIG. 3 is a sectional illustrative view showing an essential portion of the resonator shown in FIG. 1.

FIG. 1 is a perspective view showing an example of a resonator as an embodiment of the present invention, FIG. 2 is an exploded perspective view thereof, and FIG. 3 is a sectional illustrative view showing an essential portion thereof.

The resonator 20 includes, for example, a rectangular plate-shaped first dielectric layer 22a made of a ceramic layer. Two long and narrow holes (grooves) 24a and 24b are formed in parallel with each other at an interval from one end of the first dielectric layer 22a to the other end thereof. The holes 24a and 24b are formed so as to penetrate from one main surface of the first dielectric layer 22a to the other main surface thereof.

A quadrangular inner conductor 26 as a pattern electrode is formed in the first dielectric layer 22a. The inner conductor 26 includes, for example, two long and narrow band-shaped plane portions 28a and 28b. The plane portions 28a and 28b are formed between the two holes 24a and 24b on one main surface and the other main surface of the first dielectric layer 22a. Furthermore, the inner conductor 26 includes, for example, two long and narrow band-shaped side portions 30a and 30b. The side portions 30a and 30b are formed in the two holes 24a and 24b, respectively. Also, both ends of the side portion 30a in the widthwise direction thereof are connected with ends of the plane portions 28a and 28b in the widthwise direction thereof. Similarly, both ends of the side portion 30b in the widthwise direction thereof are connected with the other ends of the plane portions 28a and 28b in the widthwise direction thereof.

A second dielectric layer 22b made of a ceramic layer is formed on one main surface of the first dielectric layer 22a so as to cover the plane portion 28a of the inner conductor 26.

A first earth electrode 32a is formed on the second dielectric layer 22b so as to oppose the plane portion 28a of the inner conductor 26.

A third dielectric layer 22c made of a ceramic layer is formed on the other main surface of the first dielectric layer 22a so as to cover the plane portion 28b of the inner conductor 26.

A second earth electrode 32b is formed under the third dielectric layer 22c so as to oppose the plane portion 28b of the inner conductor 26.

A fourth dielectric layer 22d made of a ceramic layer is formed under the third dielectric layer 22c so as to cover the second earth electrode 32b.

In the resonator 20, a strip line is formed of the first through the third dielectric layers 22a through 22c, the inner conductor 26, and the first and the second earth electrodes 32a and 32b.

An example of a method for manufacturing the resonator 20 is described below.

Figure 4A:
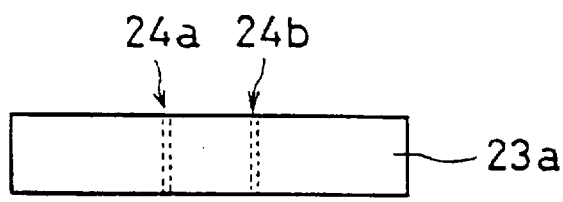
FIG. 4(A) through FIG. 4(E) are front illustrative views showing an example of a process for manufacturing the resonator shown in FIG. 1.
Figure 5:
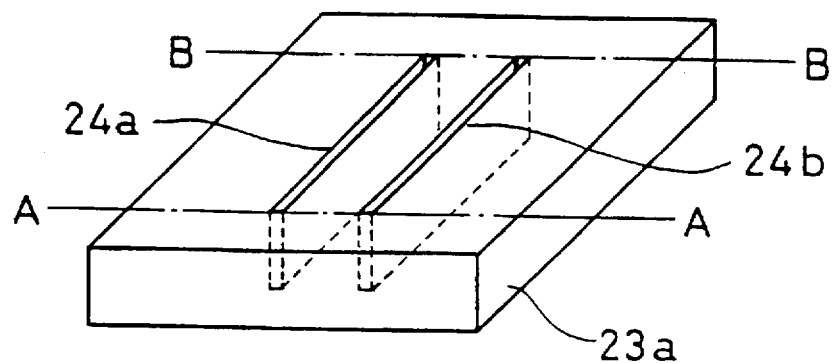
FIG. 5 is a perspective view showing an essential process for manufacturing the resonator shown in FIG. 1.

First, a ceramic green sheet 23a to form the first dielectric layer 22a is prepared. As shown in FIG. 4(A) and FIG. 5, the two long and narrow holes (grooves) 24a and 24b are formed in parallel with each other at an interval in the ceramic green sheet 23a. In this case, the holes 24a and 24b are formed so as to penetrate from one main surface of the ceramic green sheet 23a to the other main surface thereof, and are formed inward from both ends of the ceramic green sheet 23a.

Figure 4B:
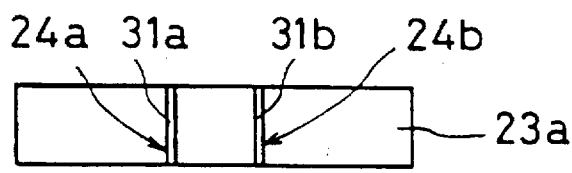

As shown in FIG. 4(B), conductive paste 31a and 31b to form the side portions 30a and 30b of the inner conductor 26 are filled in the holes 24a and 24b, respectively.

Figure 4C:
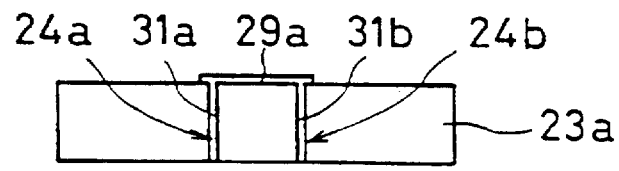

Furthermore, as shown in FIG. 4(C), conductive paste 29a to form the plane portion 28a of the inner conductor 26 is printed between the holes 24a and 24b on one main surface of the ceramic green sheet 23a so as to form a thick film thereon. In this case, the conductive paste 29a is connected with the conductive paste 31a and 31b.

Figure 4D:
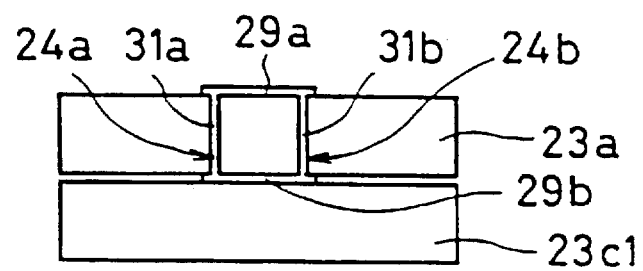

Also, a ceramic green sheet 23c1 to form a part of the third dielectric layer 22c is prepared. Conductive paste 29b to form the plane portion 28b of the inner conductor 26 is printed on the ceramic green sheet 23c1 so as to form a thick film thereon. As shown in FIG. 4(D), the ceramic green sheet 23c1 is laminated under the ceramic green sheet 23a. In this case, the conductive paste 29b on the ceramic green sheet 23b1 is positioned between the holes 24a and 24b on the other main surface of the ceramic green sheet 23a, and is connected with the conductive paste 31a and 31b.

Figure 4E:
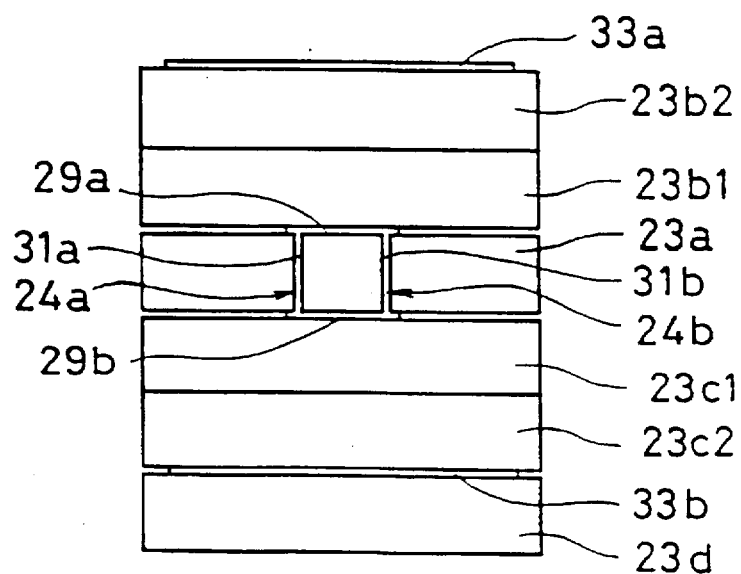

Furthermore, two ceramic green sheets 23b1 and 23b2 to form the second dielectric layer 22b are prepared. Conductive paste 33a to form the first earth electrode 32a is printed on the ceramic green sheet 23b2 so as to form a thin film thereon. Then, as shown in FIG. 4(E), the two ceramic green sheets 23b1 and 23b2 are laminated on the ceramic green sheet 23a so that the conductive paste 33a is positioned uppermost. Although not shown in the drawings, another ceramic green sheet may be laminated on the ceramic green sheet 23b2 so as to cover the conductive paste 33a, if necessary.

Also, a ceramic green sheet 23c2 to form the other part of the third dielectric layer 22c is prepared. Furthermore, a ceramic green sheet 23d to form the fourth dielectric layer 22d is prepared. Conductive paste 33b to form the second earth electrode 32b is printed on the ceramic green sheet 23d so as to form a thick film thereon. Then, as shown in FIG. 4(E), the ceramic green sheets 23c2 and 23d are laminated under the ceramic green sheets 23c1 so that the conductive paste 33b is sandwiched between the ceramic green sheets 23c2 and 23d.

Then, a laminate including these ceramic green sheets is cut at both ends thereof. In this case, the ceramic green sheet 23a is cut at portions, connecting both ends of the holes 24a and 24b, shown by one-dot chain lines A—A and B—B of FIG. 5. As a result, end portions of the conductive paste 29a, 29b, 31a and 31b to form the inner conductor 26 are exposed to the outside.

Then, the laminate is bonded by pressing and sintered, thereby the resonator 20 having the first through the fourth dielectric layers 22a through 22d, the inner conductor 26, and the first and the second earth electrodes 32a and 32b is formed.

Figure 19:
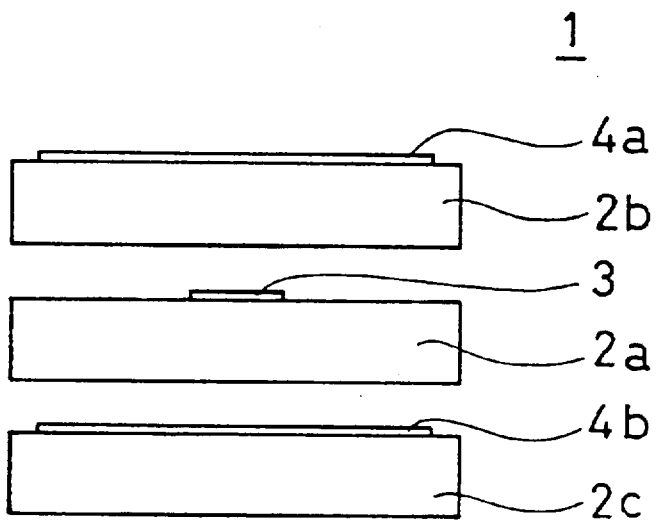
FIG. 19 is an exploded front view showing an example of a conventional resonator which is the background of the present invention.
Figure 20:
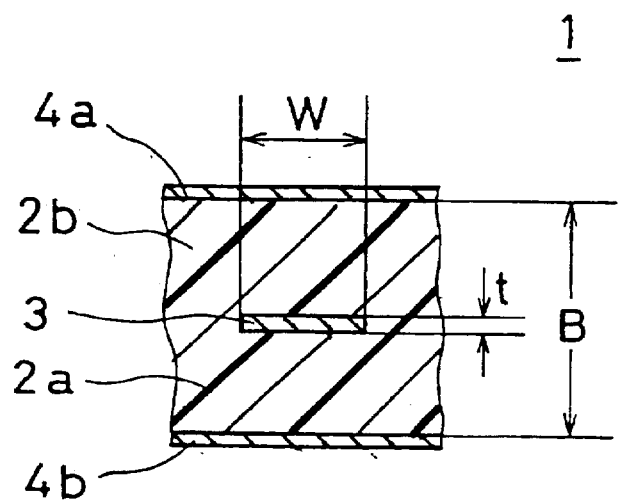
FIG. 20 is a sectional illustrative view showing an essential portion of the resonator shown in FIG. 19.

In the resonator 20, compared with the conventional resonator 1 shown in FIG. 19 and FIG. 20, since the inner conductor 26 comprises the plane portions 28a and 28b and the side portions 30a and 30b, the surface area of the inner conductor is increased, and the resistance component and the ohmic loss of the inner conductor become small. That is, in a high frequency, skin effect causes electric current to flow through only the skin of the inner conductor. Thus, in the resonator 20, compared with the conventional resonator 1 shown in FIG. 19 and FIG. 20, since the surface area of the inner conductor becomes large, the area of a path of the inner conductor through which electric current flows becomes large, and the resistance component and the ohmic loss of the inner conductor become small.

Therefore, in the resonator 20, compared with the the conventional resonator 1 shown in FIGS. 19 and 20, the Q becomes large.

As an experiment, the resonator 20 of the embodiment shown in FIG. 1 through FIG. 3 and the conventional resonator 1 shown in FIG. 19 and FIG. 20 were prepared in the following conditions:
Dielectric constant of dielectric layer: 25
Dielectric loss tangent $\delta$ of dielectric layer: 0.0025
Conductivity of inner conductor: $4 \times 10^7$ S/m
Conductivity of earth electrode: $4 \times 10^7$ S/m
Distance B between earth electrodes: 3 mm
Width W of inner conductor: 0.6 mm
Thickness t of inner conductor: 10 μm
Length of inner conductor (length of $\lambda/4$ resonator): 10 mm
Resonance frequency: 1.45 GHz
Skin thickness of inner conductor: 2 μm The Q of the resonator 20 and that of the conventional resonator 1 at the resonance frequency of 1.45 GHz were measured. The result is that in the conventional resonator 1 shown in FIG. 19 and FIG. 20, the Q is approximately 150 at the frequency of 1.45 GHz, whereas in the resonator 20 shown in FIG. 1 through FIG. 3, the Q is approximately 210 at the frequency of 1.45 GHz. Accordingly, in the resonator 20 of the embodiment shown in FIG. 1 through FIG. 3, the Q is improved by about 40%, compared with the conventional resonator 1 shown in FIG. 19 and FIG. 20.

Also, in the resonator 20, a filter can be formed by forming a plurality of inner conductors and so on.

Furthermore, in the resonator 20, a module having a resonator can be formed by forming other elements between the dielectric layers and mounting components on the surface thereof.

Figure 6:
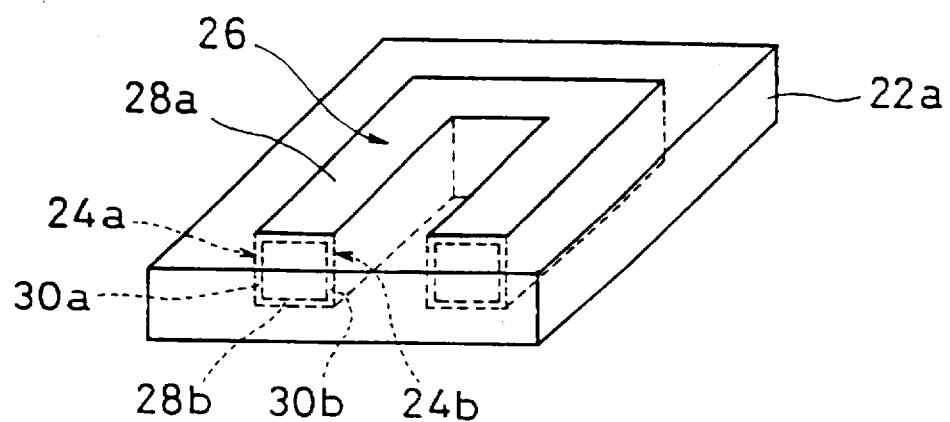
FIG. 6 is a perspective view showing an essential portion of a modification of the resonator shown in FIG. 1.

Meanwhile, in the resonator 20 shown in FIG. 1 through FIG. 3, as shown in FIG. 6, the holes 24a and 24b may be formed in a double U-shape, and the inner conductor 26 may be formed in a U-shape. In this case, since the inner conductor 26 comprises the U-shaped plane portions 28a and 28b and the U-shaped side portions 30a and 30b, the resistance component and the ohmic loss of the inner conductor 26 are decreased, the Q is improved. In this manner, the configuration of the hole and that of the inner inductor formed in the dielectric layer may be changed as desired.

Also, though there is a dielectric material inside of the inner conductor 26 of the resonator 20 shown in FIG. 1 through FIG. 3, an insulating material instead of the dielectric material may be filled inside of the inner conductor 26.

Furthermore, in the resonator 20 shown in FIG. 1 through FIG. 3, the other earth electrodes may also be formed on the sides of the first through the third dielectric layers 22a through 22c. That is, the earth electrode may be formed in a rectangular shape around the first through third dielectric layers 22a through 22c.

Figure 7:
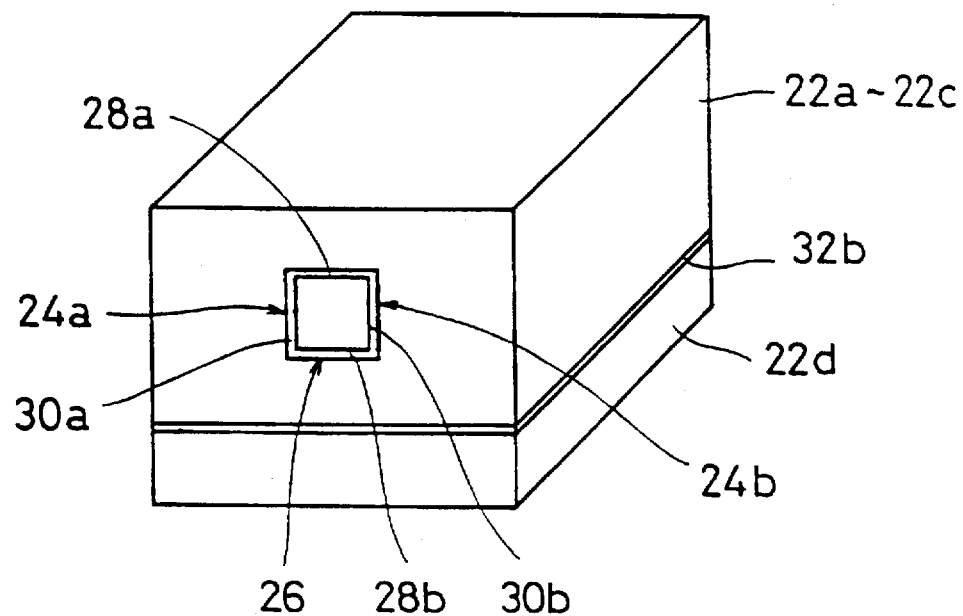
FIG. 7 is a perspective view showing another modification of the resonator shown in FIG. 1.

FIG. 7 is a perspective view showing another modification of the resonator shown in FIG. 1. In the embodiment shown in FIG. 7, compared with the embodiment shown in FIG. 1, the first earth electrode 32a is not formed. Thus, in the embodiment shown in FIG. 7, a micro strip line is formed of the first through the third dielectric layers 22a through 22c, the inner conductor 26, and the earth electrode 32b. The embodiment shown in FIG. 7 has the same effect as the embodiment shown in FIG. 1.

Meanwhile, even if the second earth electrode 32b is removed from the embodiment shown in FIG. 1, it has the same effect as the embodiment shown in FIG. 7.

Figure 8:
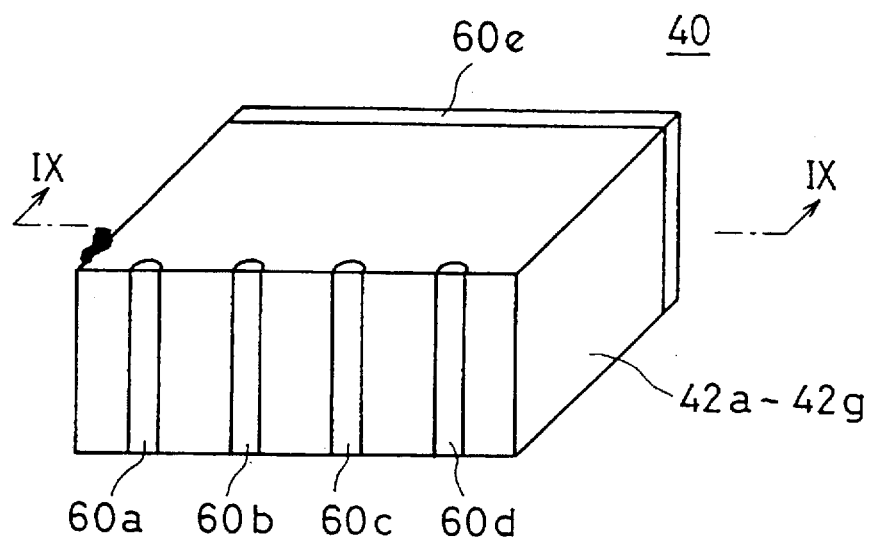
FIG. 8 is a perspective view showing an example of a filter as another embodiment of the present invention.
Figure 9:
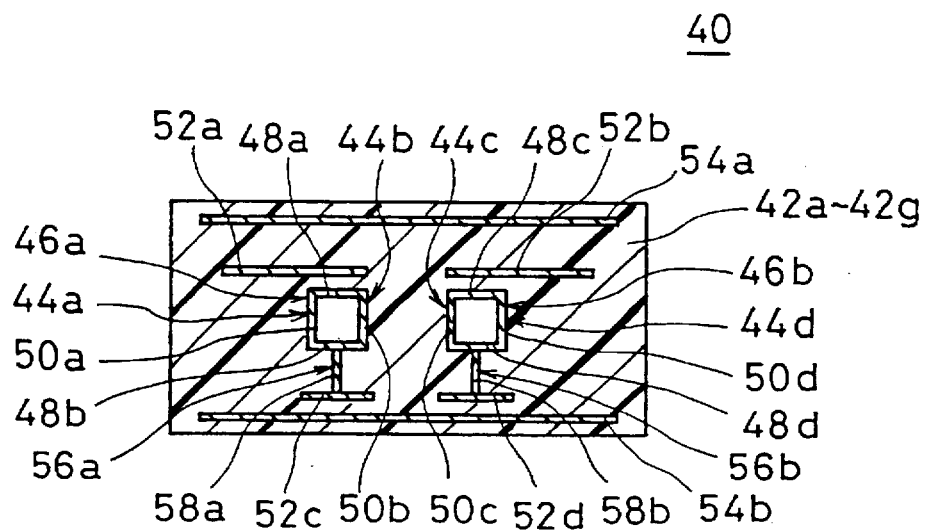
FIG. 9 is a sectional illustrative view taken along the line IX—IX of FIG. 8.
Figure 10:
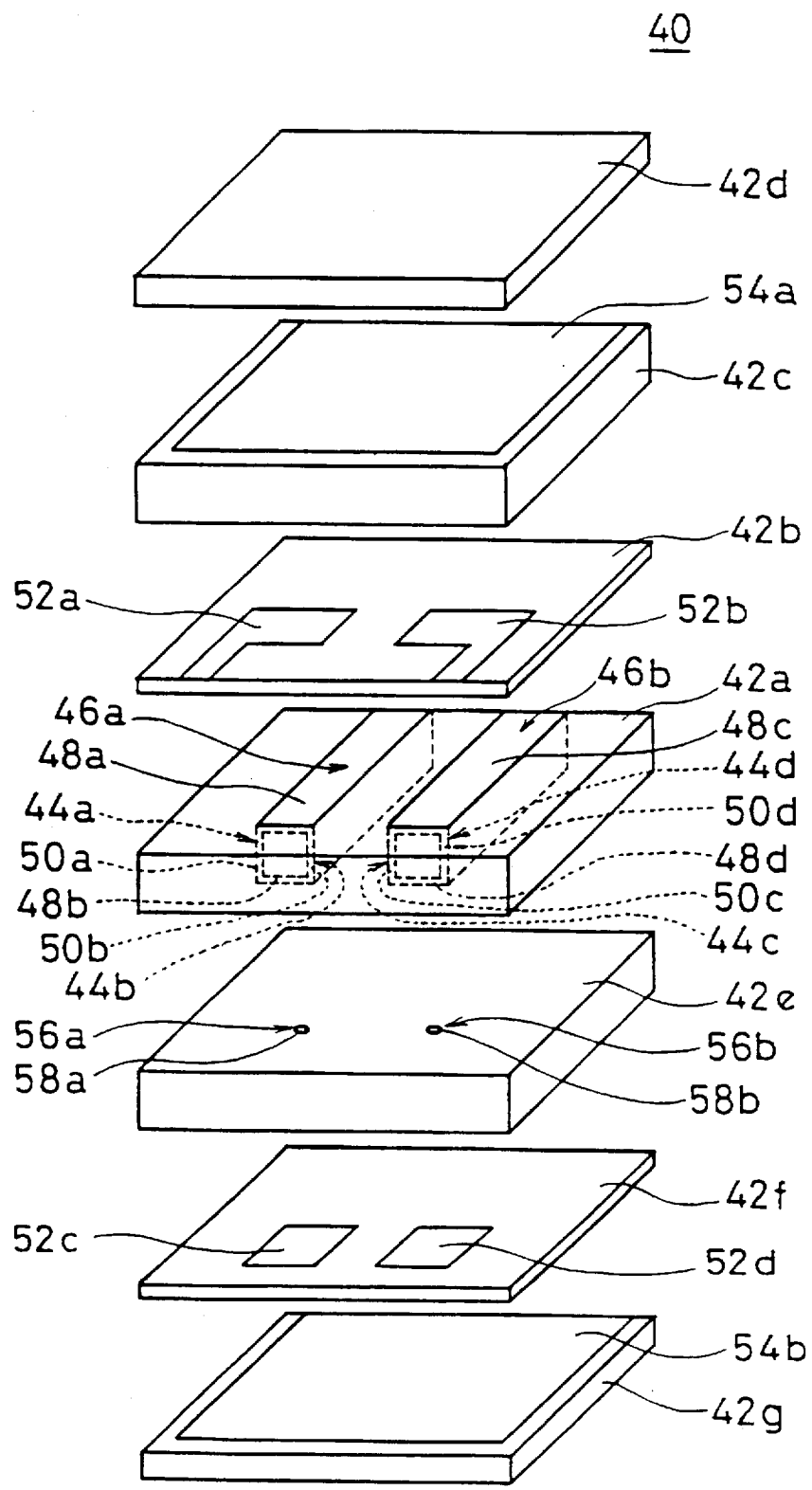
FIG. 10 is an exploded perspective view showing the filter shown in FIG. 8.
Figure 11:
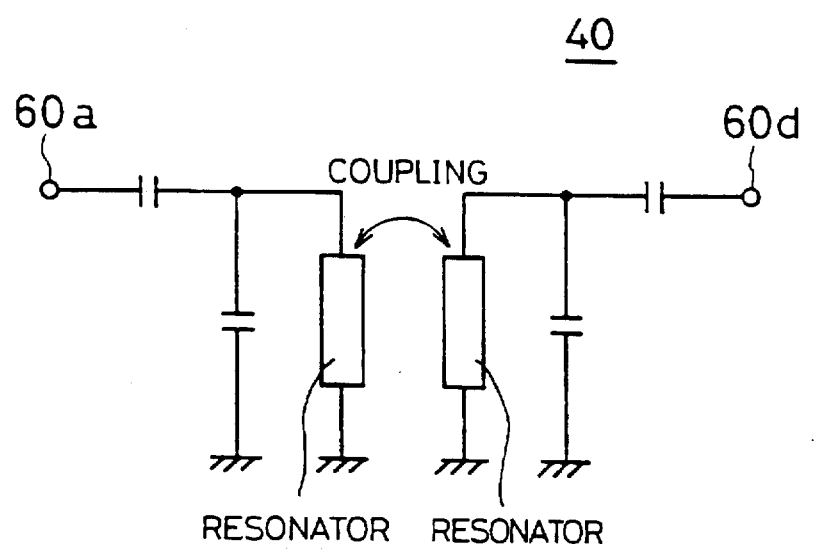
FIG. 11 is an equivalent circuit diagram of the filter shown in FIG. 8.

FIG. 8 is a perspective view showing an example of a filter as another embodiment of the present invention, FIG. 9 is a sectional illustrative view taken along the line IX—IX of FIG. 8, FIG. 10 is an exploded perspective view thereof, FIG. 11 is an equivalent circuit diagram thereof.

The filter 40 includes, for example, a rectangular plate-shaped first dielectric layer 42a made of a ceramic layer. Four long and narrow holes (grooves) 44a, 44b, 44c and 44d are formed in parallel with each other at an interval from the vicinity of one end of the first dielectric layer 42a to the other end thereof. The holes 44a, 44b, 44c and 44d are formed so as to penetrate from one main surface of the first dielectric layer 42a to the other main surface thereof.

Two quadrangular inner conductors 46a and 46b as pattern electrodes are formed in parallel with each other at an interval in the first dielectric layer 42a. The inner conductors 46a and 46b are electromagnetically coupled with each other.

The inner conductor 46a includes, for example, two long and narrow band-shaped plane portions 48a and 48b. The plane portions 48a and 48b are formed between the two holes 44a and 44b on one main surface and the other main surface of the first dielectric layer 42a. Furthermore, the inner conductor 46a includes, for example, two long and narrow band-shaped side portions 50a and 50b. The side portions 50a and 50b are formed in the two holes 44a and 44b, respectively. Also, both ends of the side portions 50a in the widthwise direction thereof are connected with ends of the plane portions 48a and 48b in the widthwise direction thereof. Both ends of the side portions 50b in the widthwise direction thereof are connected with the other ends of the plane portions 48a and 48b in the widthwise direction thereof.

Similarly, the inner conductor 46b includes, for example, two long and narrow band-shaped plane portions 48c and 48d. The plane portions 48c and 48d are formed between the two holes 44c and 44d on one main surface and the other main surface of the first dielectric layer 42a. Furthermore, the inner conductor 46b includes, for example, two long and narrow band-shaped side portions 50c and 50d. The side portions 50c and 50d are formed in the two holes 44c and 44d, respectively Also, both ends of the side portions 50c in the widthwise direction thereof are connected with ends of the plane portions 48c and 48d in the widthwise direction thereof. Both ends of the side portions 50d in the widthwise direction thereof are connected with the other ends of the plane portions 48c and 48d in the widthwise direction thereof.

A second dielectric layer 42b made of a ceramic layer is formed on one main surface of the first dielectric layer 42a so as to cover the plane portion 48a of the inner conductor 46a and the plane portion 48c of the inner conductor 46b.

Two capacitor electrodes 52a and 52b are formed on the second dielectric layer 42b so as to oppose to the plane portion 48a of the inner conductor 46a and the plane portion 48c of the inner conductor 46b.

A third dielectric layer 42c made of a ceramic layer is formed on the second dielectric layer 42b so as to cover the two capacitor electrodes 52a and 52b.

A first earth electrode 54a is formed on the third dielectric layer 42c so as to oppose to the plane portion 48a of the inner conductor 46a and the plane portion 48c of the inner conductor 46b.

A fourth dielectric layer 42d made of a ceramic layer is formed on the third dielectric layer 42c so as to cover the first earth electrode 54a.

A fifth dielectric layer 42e made of a ceramic layer is formed on the other main surface of the first dielectric layer 42a so as to cover the plane portion 48b of the inner conductor 46a and the plane portion 48d of the inner conductor 46b.

Two via-holes 56a and 56b are formed in the fifth dielectric layer 42e so as to penetrate from one main surface of thereof to the other main surface thereof. Connecting electrodes 58a and 58b are formed in the via-holes 56a and 56b, respectively. One end of the connecting electrodes 58a and that of the connecting electrode 58b are connected with the plane portion 48b of the inner conductor 46a and the plane portion 48d of the inner conductor 46b, respectively.

Two capacitor electrodes 52c and 52d are formed under the fifth dielectric layer 42e. The capacitor electrodes 52c and 52d are connected with the other ends of the connecting electrodes 58a and 58b, respectively.

A sixth dielectric layer 42f made of a ceramic layer is formed under the fifth dielectric layer 42e so as to cover the two capacitor electrodes 52c and 52d.

A second earth electrode 54b is formed under the sixth dielectric layer 42f so as to oppose to the plane portion 48b of the inner conductor 46a, the plane portion 48d of the inner conductors 46b, and the capacitor electrodes 52c and 52d.

A seventh dielectric layer 42g made of a ceramic layer is formed under the sixth dielectric layer 42f so as to cover the second earth electrode 54b.

Five outer electrodes 60a through 60e are formed on side surfaces of the first through the seventh dielectric layers 42a through 42g. The outer electrodes 60a and 60d are connected with the capacitor electrodes 52a and 52b, respectively. The outer electrodes 60a and 60d are used input/ output terminals. The outer electrode 60e is connected with an end of the inner conductor 46a, an end of the inner conductor 46b, the first earth electrode 54a and the second earth electrode 54b. The outer electrode 60e is used as an earth terminal. Meanwhile, the outer electrodes 60b and 60c are not connected with other electrodes.

Then, in the filter 40, a resonator consisting of a strip line is formed of the first, the second, the third, the fifth and the sixth dielectric layers 42a, 42b, 42c, 42e and 42f, the inner conductor 46a, and the first and the second earth electrodes 54a and 54b, another resonator consisting of another strip line is formed of the first, the second, the third, the fifth and the sixth dielectric layers 42a, 42b, 42c, 42e and 42f, the inner conductor 46b, and the first and the second earth electrodes 54a and 54b. In this case, since the inner conductors 46a and 46b are electromagnetically coupled with each other, the two resonators are also electromagnetically coupled with each other.

Furthermore, in the filter 40, each capacitor is formed between the capacitor electrode 52a and the inner conductor 46a, between the capacitor electrode 52b and the inner conductor 46b, between the capacitor electrode 52c and the second earth electrode 54b, and between the capacitor electrode 52d and the second earth electrode 54b.

Accordingly, the filter 40 has an equivalent circuit shown in FIG. 11.

An example of a method for manufacturing the filter 40 is described below.

Figure 12A:
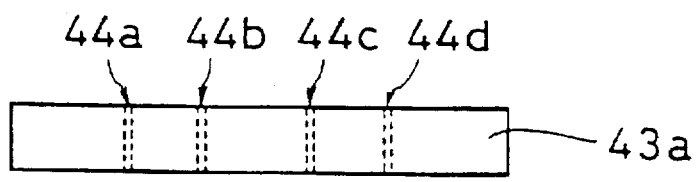
FIG. 12(A) through FIG. 12(E) are front illustrative views showing an example of a process for manufacturing the filter shown in FIG. 8.

First, a ceramic green sheet 43a to form the first dielectric layer 42a is prepared. As shown in FIG. 12(A), the four long and narrow holes 44a, 44b, 44c and 44b are formed in parallel with each other at an interval in the ceramic green sheet 43a. In this case, the holes 44a through 44d are formed so as to penetrate from one main surface of the ceramic green sheet 43a to the other main surface thereof, and are formed from the vicinity of one end of the ceramic green sheet 43a to the other end thereof.

Figure 12B:
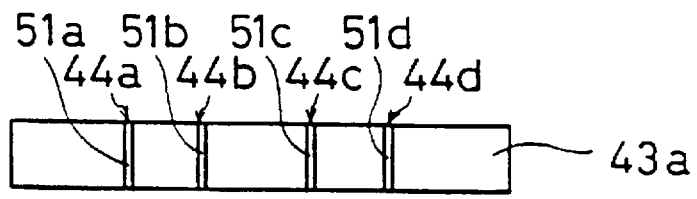

As shown in FIG. 12(B), conductive paste 51a through 51d to form the side portions 50a through 50d of the inner conductors 46a and 46b are filled in the holes 44a through 44d, respectively.

Figure 12C:
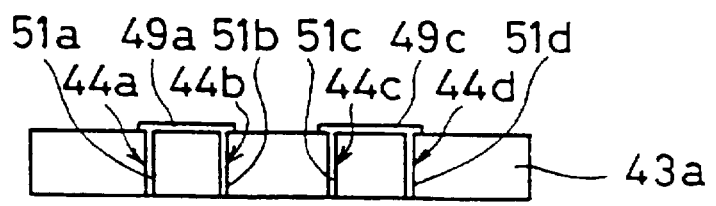

Furthermore, as shown in FIG. 12(C), conductive paste 49a and 49c to form the plane portions 48a and 48c of the inner conductors 46a and 46b are respectively printed between the holes 44a and 44b and between the holes 44c and 44d on one main surface of the ceramic green sheet 43a so as to form a thick film thereon. In this case, the conductive paste 49a is connected with the conductive paste 51a and 51b, while the conductive paste 49c is connected with the conductive paste 51c and 51d.

Figure 12D:
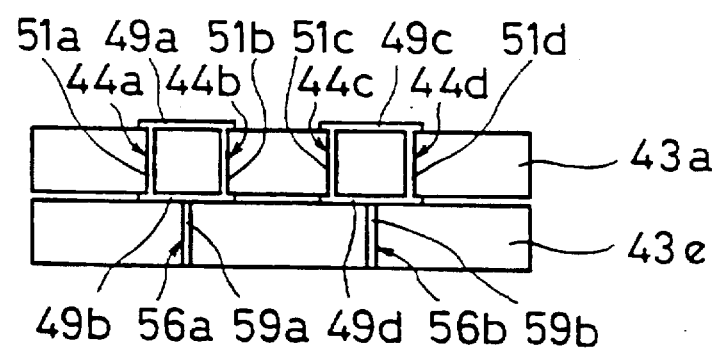

Also, a ceramic green sheet 43e to form the fifth dielectric layer 42e is prepared. The via-holes 56a and 56b are formed in the ceramic green sheet 43e. Conductive paste 59a and 59b to form the connecting electrodes 58a and 58b are filled in the via-holes 56a and 56b, respectively. Furthermore, conductive paste 49b and 49d to form the plane portions 48b and 48d of the inner conductors 46a and 46b are respectively printed on the ceramic green sheet 43e to form a thick film thereon. In this case, the conductive paste 49b and 49d are connected with the conductive paste 59a and 59b, respectively. Then, as shown in FIG. 12(D), the ceramic green sheet 43e is laminated under the ceramic green sheet 43a. In this case, the conductive paste 49b on the ceramic green sheet 43e is positioned between the holes 44a and 44b on the other main surface of the ceramic green sheet 43a, and is connected with the conductive paste 51a and 51b. Also, the conductive paste 49d on the ceramic green sheet 43e is positioned between the holes 44c and 44d on the other main surface of the ceramic green sheet 43a, and is connected with the conductive paste 51c and 51d.

Figure 12E:
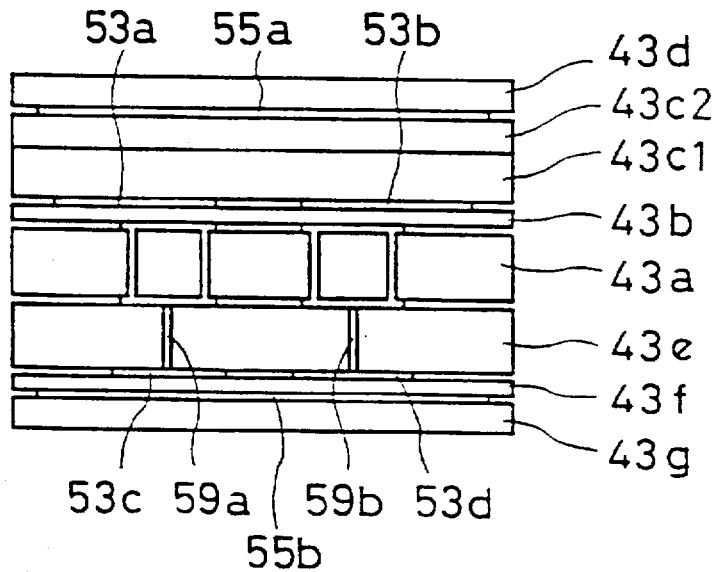

Furthermore, a ceramic green sheet 43b to form the second dielectric layer 42b is prepared. Conductive paste 53a and 53b to form the two capacitor electrodes 52a and 52b are respectively printed on the ceramic green sheet 43b to form a thick film thereon. Then, as shown in FIG. 12(E), the ceramic green sheet 43b is laminated on the ceramic green sheet 43a so that the conductive paste 53a and 53b are positioned over the ceramic green sheet 43b.

Also, two ceramic green sheets 43c1 and 43c2 to form the third dielectric layer 42c are prepared. Conductive paste 55a to form the first earth electrode 54a is printed on the ceramic green sheet 43c2 to form a thick film thereon. Then, as shown in FIG. 12(E), the two ceramic green sheets 43c1 and 43c2 are laminated on the ceramic green sheet 43b so that the conductive paste 55a is positioned over the ceramic green sheet 43c2.

Furthermore, a ceramic green sheet 43d to form the fourth dielectric layer 42d is prepared. As shown in FIG. 12(E), the ceramic green sheet 43d is laminated on the ceramic green sheet 43c2 so as to cover the conductive paste 55a.

Also, a ceramic green sheet 43f to form the sixth dielectric layer 42f is prepared. Conductive paste 53c and 53d to form the two capacitor electrodes 52c and 52d are respectively printed on the ceramic green sheet 43f to form a thick film thereon. Then, as shown in FIG. 12(E), the ceramic green sheet 43f is laminated under the ceramic green sheet 43e so that the conductive paste 53c and 53d are connected with the conductive paste 59a and 59b, respectively.

Furthermore, a ceramic green sheet 43g to form the seventh dielectric layer 42g is prepared. Conductive paste 55b to form the second earth electrode 54b is printed on the ceramic green sheet 43g to form a thick film thereon. Then, as shown in FIG. 12(E), the ceramic green sheet 43g is laminated under the ceramic green sheet 43f so that the conductive paste 55b is sandwiched between the ceramic green sheets 43f and 43g.

Then, a laminate including these ceramic green sheets is bonded by pressing, sintered and so on, thereby the first through the seventh dielectric layers 42a through 42g, the inner conductors 46a and 46b, the capacitor electrodes 52a through 52d, the first and the second earth electrodes 54a and 54b, and the connecting electrodes 58a and 58b are formed. Meanwhile, the ceramic green sheet 43d is formed as necessary, and thus it may be deleted.

Then, an electrode material such as silver is baked on the side surfaces of the first through the seventh dielectric layers 42a through 42g, thereby the outer electrodes 60a through 60e are formed, and the filter 40 is manufactured.

Figure 21:
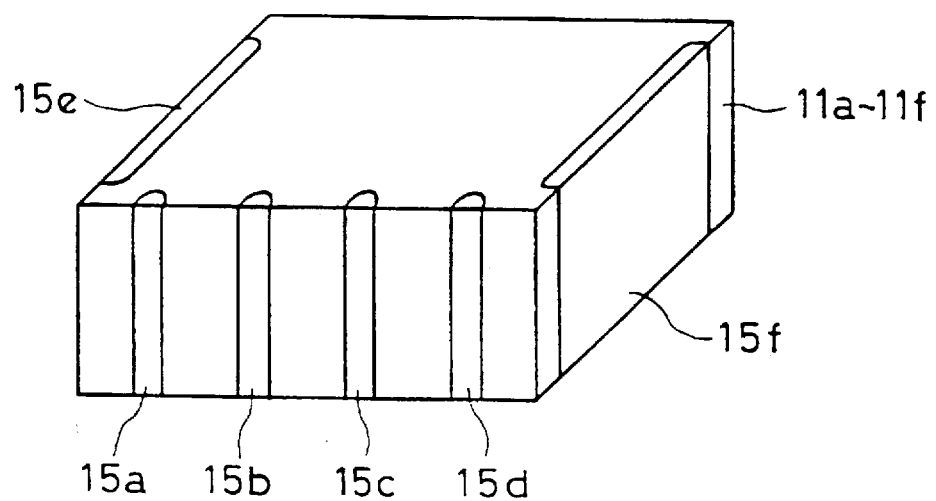
FIG. 21 is a perspective view showing an example of a conventional filter which is the background of the present invention.
Figure 22:
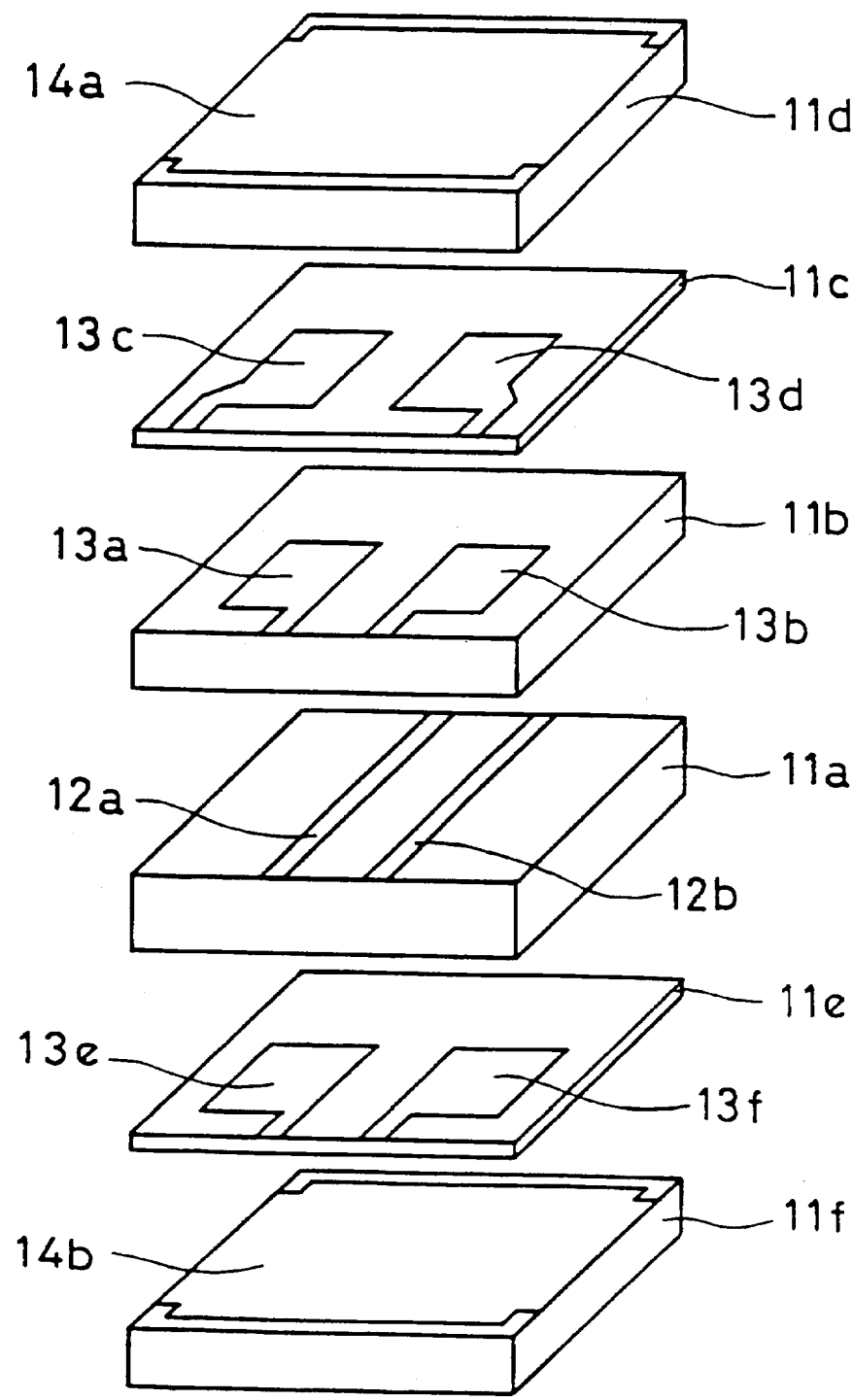
FIG. 22 is an exploded perspective view showing the filter shown in FIG. 21.
Figure 23:
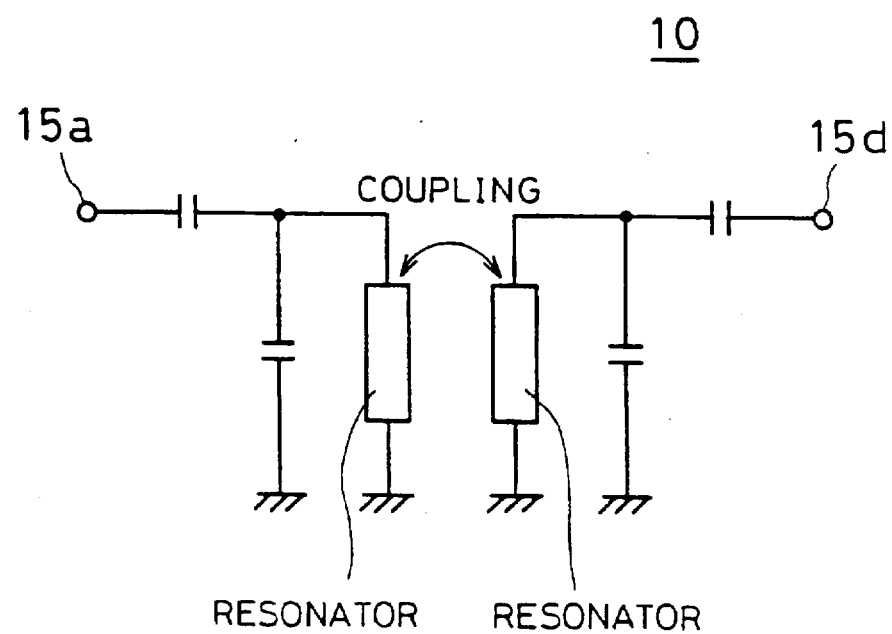
FIG. 23 is an equivalent circuit diagram of the filter shown in FIG. 21.

In the filter 40, compared with the conventional filter 1 shown in FIG. 21 and FIG. 22, since the inner conductor 46a comprises the plane portions 48a and 48b and the side portions 50a and 50b, and the inner conductor 46b comprises the plane portions 48c and 48d and the side portions 50c and 50d, each surface area of inner conductors is increased, each area of paths of inner conductors through which electric current flows becomes large, and each resistance component and each ohmic loss of the inner conductors become small.

Therefore, in the filter 40 of this embodiment, compared with the conventional filter 10 shown in FIG. 21 and FIG.

Figure 13:
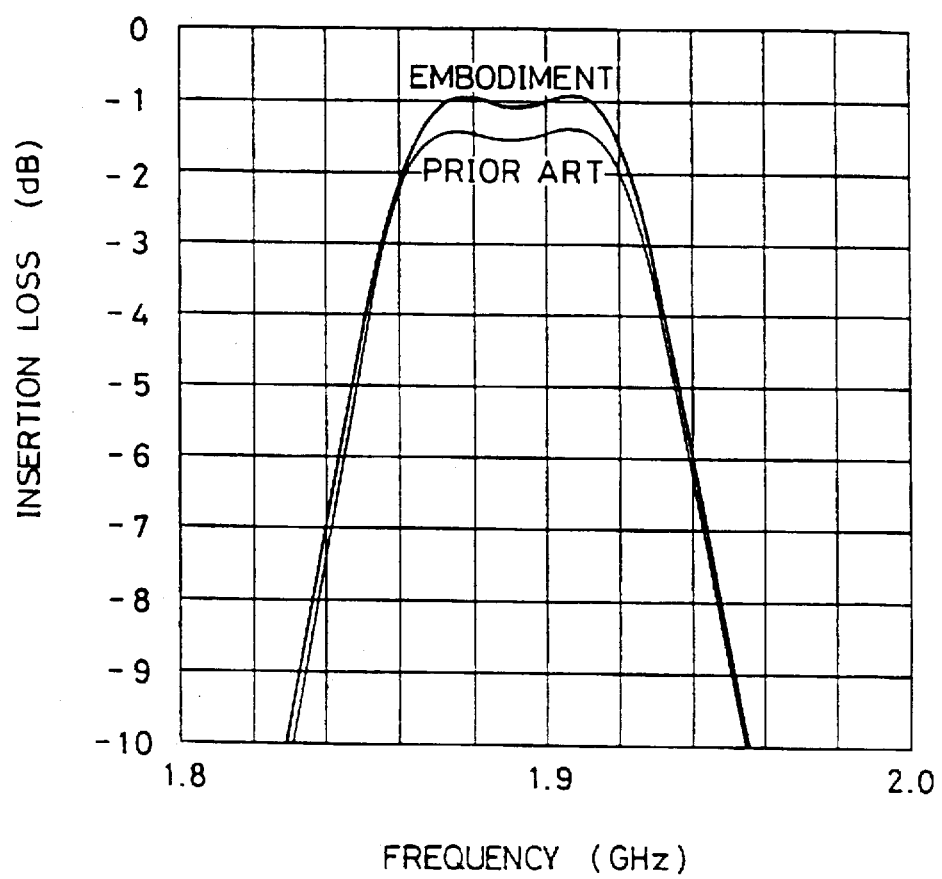
FIG. 13 is a graph showing a frequency characteristic of the filter shown in FIG. 8 and a frequency characteristic of a filter shown in FIG. 21.

22, each Q of the resonators becomes large, and the insertion loss becomes small. As showing a frequency characteristic of the filter 40 of 8 mm×5 mm×3 mm and that of the conventional filter 10 of the same size in FIG. 13, in the filter 40 of this embodiment, compared with the conventional filter 10 shown in FIG. 21 and FIG. 22, the insertion loss becomes lower by about 0.5 dB.

Meanwhile, as a conventional filter having a low insertion loss, a filter using a plurality of dielectric resonators is known, although the filter is not a laminated ceramic electronic component. In the conventional filter using the dielectric resonators, the dielectric resonators are arranged, each capacitor is provided between the dielectric resonators, and the capacitors and so on are covered with a casing having a shield effect. In the conventional filter using the dielectric resonators, since the surface area of an inner conductor of the dielectric resonator is allowed to be large, the resistance component and the ohmic loss of the inner conductor are small, the Q is large, and the insertion loss is small. However, in the conventional filter using the dielectric resonators, since the capacitors, the casing and so on are provided outside the dielectric resonators, the conventional filter is large and a complicated manufacturing method is required.

On the other hand, the filter 40 of this embodiment has the same characteristics as the conventional filter using the dielectric resonators, since the embodiment filter has the same surface area of the inner conductors as the conventional filter. Also, in the filter 40 of this embodiment, the capacitors and the resonators are contained in a laminated state and are integrated with each other. Thus, the filter 40 is compact. Furthermore, since the filter 40 can be formed by laminating a plurality of ceramic green sheets and so on, it can be manufactured by a simple process.

When earth electrodes are formed on both side surfaces of the first through the seventh dielectric layers 42a through 42g of the filter 40 of this embodiment, a magnetic field generated in the periphery of the inner conductors 46a and 46b is shielded by these earth electrodes, thus the magnetic field can be prevented from leaking to the outside.

Furthermore, though there is a dielectric material inside of the inner conductors 46a and 46b of the filter 40 of this embodiment, an insulating material instead of the dielectric material may be filled inside of the inner conductors 46a and 46b.

Meanwhile, though a dielectric layer is formed by the ceramic layer in the above-mentioned embodiments, an insulating layer may be formed by the ceramic layer in the present invention.

Also, though the dielectric layer serving as the ceramic layer is made of one or two ceramic green sheets in the above-mentioned embodiments, the number of the ceramic green sheets to form the ceramic layer and the thickness thereof may be changed as desired in the present invention. In particular, when the thickness of the ceramic layer having a hole to be formed as a side portion of a pattern electrode such as an inner conductor is changed, since the surface area of the side portion of the pattern electrode is changed, the resistance component and the ohmic loss of the pattern electrode can be changed. Meanwhile, when the width of the plane portion of the pattern electrode is changed, since the surface area of the plane portion of the pattern electrode is changed, the resistance component and the ohmic loss of the pattern electrode can be changed.

Figure 14:
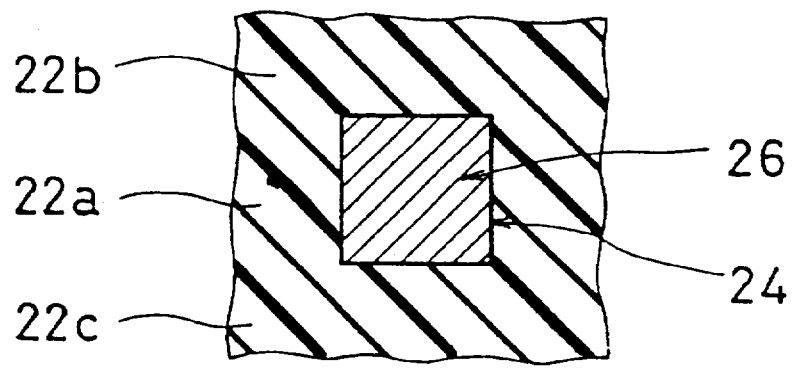
FIG. 14 is a sectional view showing an essential portion of another modification of the resonator shown in FIG. 1.
Figure 15:
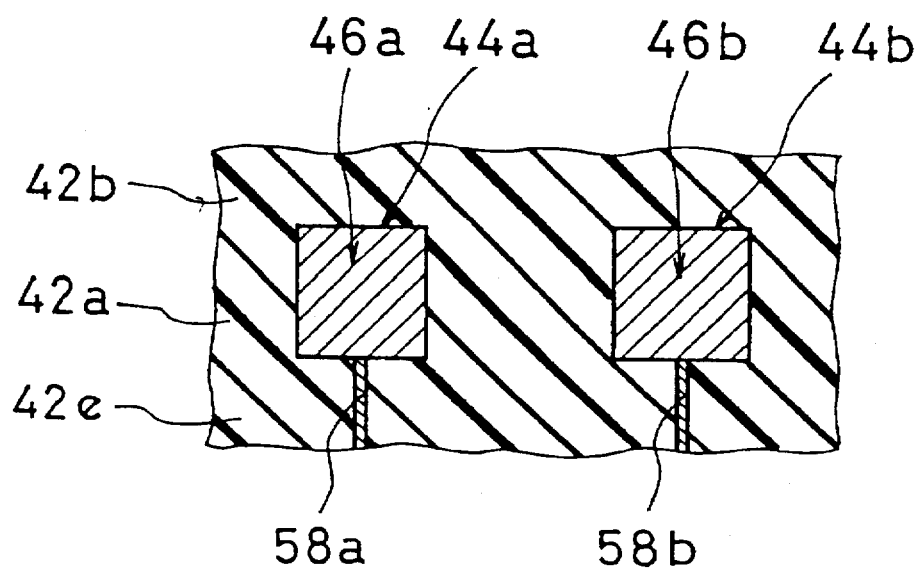
FIG. 15 is a sectional view showing an essential portion of a modification of the filter shown in FIG. 8.
Figure 16:
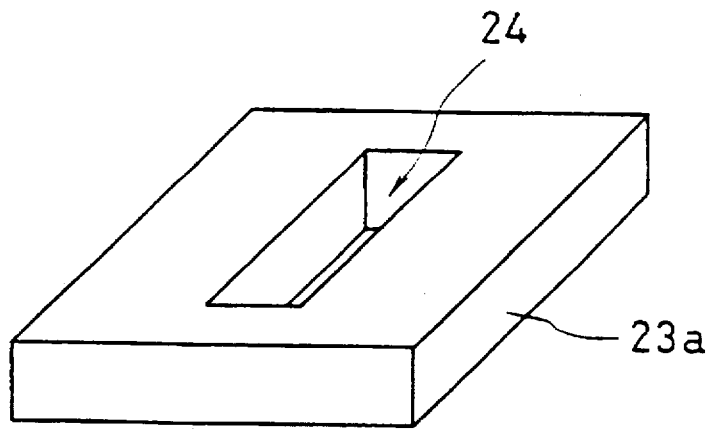
FIG. 16 is a perspective view showing an essential process for manufacturing the resonator shown in FIG. 14.
Figure 17:
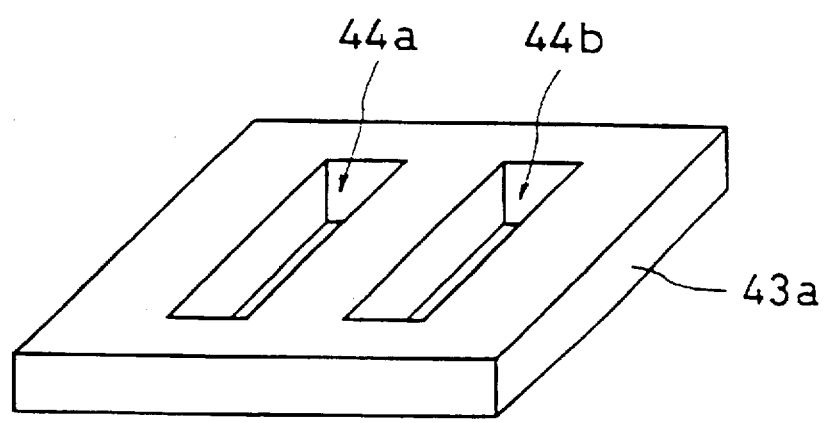
FIG. 17 is a perspective view showing an essential process for manufacturing the filter shown in FIG. 15.

Furthermore, though there is a ceramic dielectric material inside of the inner conductor as a pattern electrode in the above-mentioned embodiments, as shown in FIG. 14 and FIG. 15, a conductive member may be formed inside each of the inner conductors 26, 46a and 46b, whereby the inner conductors may be formed into a bar-shaped configuration. In order to form the inner conductors 26, 46a and 46b into the bar-shaped configuration, in the above-mentioned manufacturing method, instead of forming the holes 24a, 24b and 44a through 44d in the ceramic green sheets 23a and 43a, as shown in FIG. 16 and FIG. 17, holes 24, 44a and 44b corresponding to the bar-shaped inner conductors 26, 46a and 46b are formed in the ceramic green sheets 23a and 43a, and then, conductive paste is filled in the holes 24, 44a and 44b.

Figure 18:
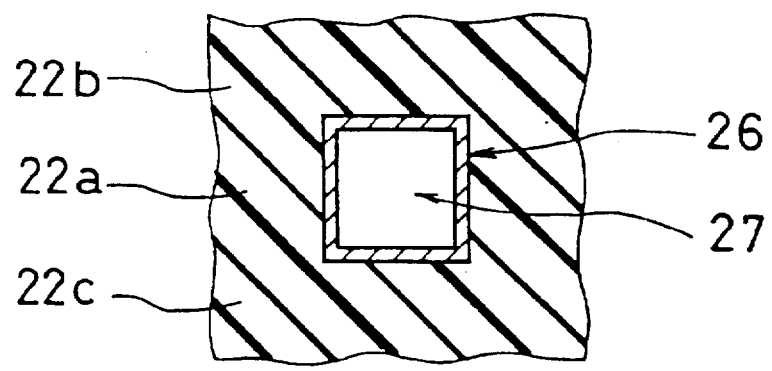
FIG. 18 is a sectional view showing an essential portion of a still another modification of the resonator shown in FIG. 1.

Also, though there is a ceramic dielectric material inside of the inner conductor as a pattern electrode in the embodiments shown in FIG. 1 through FIG. 12, as shown in FIG. 18, a cavity 27 may be formed inside the inner conductor 26. Similarly, cavities may be formed inside the inner conductors 46a and 46b.

Furthermore, though the inner conductor as a pattern electrode is formed with a quadrangular cross section in the above-mentioned embodiments, an inner conductor may be formed into, for example, an L-shaped or U-shaped configuration in section in the present invention.

Also, though the conductive paste is printed in a thick layer on the ceramic green sheet to form the electrode in the above-mentioned embodiments, the electrode may be formed by another known means.

Furthermore, though the dielectric layer and the earth electrode are formed above and below the pattern electrode in the above-mentioned embodiments, the dielectric layer and the earth electrode may be formed above or below the pattern electrode.

It will be apparent from the foregoing that, while the present invention has been described in detail and illustrated, these are only particular illustration and example, and the present invention is not limited to these. The spirit and scope of the present invention is limited only by the appended claims.

What is claimed is:

1. A method for manufacturing a laminated ceramic electronic component, comprising the steps of:

forming a first ceramic layer from a ceramic green sheet, said first ceramic layer including first and second spaced apart main surfaces and first and second spaced apart end surfaces extending between said main surfaces;

forming a first aperture through said ceramic green sheet extending from said first main surface to said second main surface;

forming a second aperture through said ceramic green sheet extending from said first main surface to said second main surface, said second aperture being spaced away from said first aperture;

filling said first and second apertures with conductive material to form at least a part of a conductive pattern electrode;

disposing conductive material on said first main surface of said ceramic layer proximate to said filled apertures to form at least another part of said pattern electrode such that said pattern electrode includes an interior surface and an exterior surface, said interior surface defining an interior region of said pattern electrode which is substantially filled with the ceramic material of said ceramic green sheet;

forming at least a second ceramic layer from a ceramic green sheet and disposing it on said first ceramic layer; and sintering said ceramic green sheets of said first and second ceramic layers to form said ceramic electronic component.

2. The method for manufacturing a laminated ceramic electronic component of claim 1, further comprising the step of disposing conductive material on said second main surface of said first ceramic layer proximate to said filled apertures to form at least another part of said pattern electrode.

3. The method for manufacturing a laminated ceramic electronic component of claim 2, wherein:
   said first and second apertures are substantially elongate and extend through said first ceramic green sheet substantially perpendicularly to said first and second main surfaces; and
   said conductive material disposed on said first and second main surfaces of said first ceramic layer connecting with said conductive material within said first and second apertures to form said pattern electrode, such that said pattern electrode has a quadrangular shape.

4. A method for manufacturing a resonator, comprising the steps of:
   forming a first ceramic layer from a first ceramic green sheet, said first ceramic layer including first and second spaced apart main surfaces and first and second spaced apart end surfaces extending between said main surfaces;
   forming a first aperture through said first ceramic green sheet extending from said first main surface to said second main surface;
   forming a second aperture through said first ceramic green sheet extending from said first main surface to said second main surface, said second aperture being spaced away from said first aperture;
   filling said first and second apertures with conductive material to form at least a part of an inner conductor;
   disposing conductive material on said first main surface of said first ceramic layer proximate to said filled apertures to form at least another part of said inner conductor such that said inner conductor includes an interior surface and an exterior surface, said interior surface defining an interior region of said inner conductor which is substantially filled with the ceramic material of said first ceramic green sheet;
   forming a second ceramic layer from a second ceramic green sheet;
   disposing conductive material on said second ceramic green sheet to form a ground electrode;
   disposing said second ceramic green sheet on said first ceramic green sheet such that said ground electrode is spaced away from and substantially parallel with said inner conductor; and
   sintering said ceramic green sheets of said first and second ceramic layers to form said resonator.

5. The method for manufacturing the resonator of claim 4, further comprising the step of:
   disposing conductive material on said second main surface of said first ceramic layer proximate to said filled apertures to form at least another part of said inner conductor,
   said first and second apertures being substantially elongate and extending through said first ceramic green sheet substantially perpendicularly to said first and second main surfaces,
   said conductive material disposed on said first and second main surfaces of said first ceramic layer connecting with said conductive material within said first and second apertures to form said inner conductor,
   said inner conductor having a quadrangular shape and having a thickness substantially equal to a thickness of said first ceramic layer.

6. A method for manufacturing a filter, comprising the steps of:
   forming a first ceramic layer from a first ceramic green sheet, said first ceramic layer including first and second spaced apart main surfaces and first and second spaced apart end surfaces extending between said main surfaces;
   forming a first aperture through said first ceramic green sheet extending from said first main surface to said second main surface;
   forming a second aperture through said first ceramic green sheet extending from said first main surface to said second main surface, said second aperture being spaced away from said first aperture;
   forming a third aperture through said first ceramic green sheet extending from said first main surface to said second main surface;
   forming a fourth aperture through said first ceramic green sheet extending from said first main surface to said second main surface, said fourth aperture being spaced away from said third aperture;
   filling said first and second apertures with conductive material to form portions of a first inner conductor;
   filling said third and fourth apertures with conductive material to form portions of a second inner conductor;
   disposing conductive material on said first main surface of said first ceramic layer proximate to said filled first and second apertures to form another portion of said first inner conductor such that said first inner conductor includes a first interior surface and a first exterior surface, said first interior surface defining a first interior region which is substantially filled with the ceramic material of said first ceramic green sheet;
   disposing conductive material on said first main surface of said first ceramic layer proximate to said filled third and fourth apertures to form another portion of said second inner conductor such that said second inner conductor includes a second interior surface and a second exterior surface, said second interior surface defining a second interior region which is substantially filled with the ceramic material of said first ceramic green sheet;
   forming a second ceramic layer from a second ceramic green sheet;
   disposing conductive material on said second ceramic green sheet to form a ground electrode;
   disposing said second ceramic green sheet on said first ceramic green sheet such that said ground electrode is spaced away from and substantially parallel with said first and second inner conductors; and
   sintering said ceramic green sheets of said first and second ceramic layers to form said filter.

7. The method for manufacturing the filter of claim 6, further comprising the steps of:
   disposing conductive material on said second main surface of said first ceramic layer proximate to said filled first and second apertures to form another portion of said first inner conductor; and
   disposing conductive material on said second main surface of said first ceramic layer proximate to said filled third and fourth apertures to form another portion of said second inner conductor said apertures being substantially elongate and extending through said first ceramic green sheet substantially perpendicularly to said first and second main surfaces, respective portions of said conductive material disposed on said first and second main surfaces of said first ceramic layer connecting with said conductive material within said first and second apertures and within said third and forth apertures to form said first and second inner conductors, respectively, said inner conductors having a quadrangular shape and having respective thicknesses substantially equal to a thickness of said first ceramic layer.

* * * * *